US011914086B2

(12) United States Patent
Sanuki

(10) Patent No.: US 11,914,086 B2
(45) Date of Patent: Feb. 27, 2024

(54) RADIATION DETECTION DEVICE, SEMICONDUCTOR MEMORY DEVICE AND RADIATION DETECTION METHOD

(71) Applicant: KIOXIA CORPORATION, Tokyo (JP)

(72) Inventor: Tomoya Sanuki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/666,463

(22) Filed: Feb. 7, 2022

(65) Prior Publication Data

US 2023/0060583 A1 Mar. 2, 2023

(30) Foreign Application Priority Data

Aug. 31, 2021 (JP) ................................ 2021-141204

(51) Int. Cl.

*G01T 1/24* (2006.01)
*G01T 7/00* (2006.01)
*G01T 1/02* (2006.01)
*G01T 1/16* (2006.01)
*H10B 80/00* (2023.01)

(52) U.S. Cl.

CPC .............. *G01T 1/244* (2013.01); *G01T 1/026* (2013.01); *G01T 1/1606* (2013.01); *G01T 1/242* (2013.01); *G01T 1/245* (2013.01); *G01T 1/247* (2013.01); *G01T 7/00* (2013.01); *H10B 80/00* (2023.02)

(58) Field of Classification Search

CPC ....... G01T 1/244; G01T 1/026; G01T 1/1606; G01T 1/242; G01T 1/245; G01T 1/247

See application file for complete search history.

(56) References Cited

U.S. PATENT DOCUMENTS

| | | | | |
|---|---|---|---|---|
| 5,596,199 | A | 1/1997 | McNulty et al. | |
| 7,902,520 | B2 | 3/2011 | Hossain et al. | |
| 8,791,418 | B2 * | 7/2014 | Visconti | G01T 1/026 250/370.07 |
| 9,134,440 | B2 | 9/2015 | Sanuki et al. | |
| 9,835,742 | B1 * | 12/2017 | Nagarkar | G01T 3/08 |
| 2004/0227094 | A1 * | 11/2004 | Tompa | G01T 1/245 250/370.01 |

(Continued)

FOREIGN PATENT DOCUMENTS

| | | | | |
|---|---|---|---|---|
| JP | 2008250737 | A | * | 10/2008 |
| JP | 2014-185852 | A | | 10/2014 |
| TW | 200935611 | A | | 8/2009 |

OTHER PUBLICATIONS

S.Kimura, et al., "Breakdown Phenomena in SD Cards Exposed to Proton Irradiation", Noda, Japan, Trans. JSASS Aerospace Tech. Japan, vol. 12, pp. 31-35, 2014, 5 pages.

(Continued)

*Primary Examiner* — David P Porta
*Assistant Examiner* — Casey Bryant
(74) *Attorney, Agent, or Firm* — Kim & Stewart LLP

(57) ABSTRACT

A radiation detection device includes a non-volatile memory chip including a plurality of stacked memory cells, and a controller configured to detect gamma rays incident on the non-volatile memory chip during a gamma ray detection window according to a data inversion or a threshold voltage change of at least some of the memory cells in the non-volatile memory chip during the gamma ray detection window.

20 Claims, 10 Drawing Sheets

(56) References Cited

U.S. PATENT DOCUMENTS

| | | | | |
|---|---|---|---|---|
| 2008/0308747 | A1 | 12/2008 | Gordon | |
| 2009/0166550 | A1* | 7/2009 | Gazda | G01T 3/08 250/392 |
| 2013/0193537 | A1* | 8/2013 | Hossain | H01L 27/14676 257/429 |
| 2014/0151774 | A1* | 6/2014 | Rhie | H01L 29/66833 257/314 |
| 2014/0284488 | A1* | 9/2014 | Sanuki | G01T 1/2928 250/370.09 |
| 2023/0017909 | A1* | 1/2023 | Sanuki | G11C 11/4093 |

OTHER PUBLICATIONS

Japan Aerospace Exploration Agency, "Passive Dosimeter for Lifescience Experiments in Space: PADLES" with English Translation, Japan Aerospace Exploration Agency, Nov. 11, 2015, 12 pages. URL: https://iss.jaxa.jp/kiboexp/equipment/pm/padles/.

* cited by examiner

1: RADIATION DETECTION DEVICE

FIG. 6

| | RADIATION DETECTION DEVICE OF PRESENT EMBODIMENT | RADIATION DETECTION DEVICE OF FIRST COMPARATIVE EXAMPLE | RADIATION DETECTION DEVICE OF SECOND COMPARATIVE EXAMPLE | RADIATION DETECTION DEVICE OF THIRD COMPARATIVE EXAMPLE |
|---|---|---|---|---|
| DEVICE STRUCTURE | NON-VOLATILE MEMORY CHIP HAVING THREE-DIMENSIONAL STRUCTURE<br><br>Si FILM THICKNESS: 5 μm × 100 chips<br>PIXEL PITCH: 0.2 μm<br>NUMBER OF PIXELS: 32k × 1k 32 Mpixel<br>PIXEL AREA: 1 $cm^2$ OR MORE | SOI TYPE SILICON DETECTOR<br><br>Si FILM THICKNESS: 500 μm<br>PIXEL PITCH: 6 μm<br>NUMBER OF PIXELS: 600 × 300 200 kpixel<br>PIXEL AREA: 2 $cm^2$ OR MORE | Si STRIP TYPE DETECTOR (TWO LAYERS)<br><br>Si FILM THICKNESS: 100 μm OR LESS<br>PIXEL PITCH: 400 μm OR LESS | CdTe STRIP TYPE DETECTOR<br><br>CdTe THICKNESS: 500 μm OR LESS<br>PIXEL PITCH: 1 mm OR LESS<br>NUMBER OF PIXELS: 128 × 128 (16 kpixel) |
| DETECTION INTENSITY (QUANTUM EFFICIENCY) | COMPTON SCATTERING GENERATION RATE: 0.01%/chip OR LESS<br>COMPTON SCATTERING GENERATION RATE: 1%/100 chips OR LESS | COMPTON SCATTERING GENERATION RATE IN Si SENSOR UNIT: 1% OR LESS | COMPTON SCATTERING GENERATION RATE IN Si LAYER: 1% OR LESS | PHOTOELECTRIC EFFECT GENERATION RATE IN CdTe LAYER: 10% |
| OPERATION POWER | ZERO (UNNECESSARY) | NECESSARY | NECESSARY | NECESSARY |

1a: RADIATION DETECTION DEVICE

RADIATION DETECTION DEVICE, SEMICONDUCTOR MEMORY DEVICE AND RADIATION DETECTION METHOD

CROSS-REFERENCE TO RELATED APPLICATION

This application is based upon and claims the benefit of priority from Japanese Patent Application No. 2021-141204, filed Aug. 31, 2021, the entire contents of which are incorporated herein by reference.

FIELD

Embodiments described herein relate generally to a radiation detection device, a semiconductor memory device, and a radiation detection method.

BACKGROUND

Since gamma rays included in cosmic rays have excellent straightness, a position of a generation source of gamma rays can be estimated by detecting the gamma rays and can be applied, for example, to find a new celestial body.

In order to detect gamma rays, the gamma rays have to collide with a certain material. In order to increase the probability of collision, the material needs to be thickened, but this increases the size of a gamma ray detection device. Further, as the size of the detection device increases, power consumption also increases.

DESCRIPTION OF THE DRAWINGS

FIG. 6 is a diagram illustrating a comparison between the radiation detection device according to the present embodiment and radiation detection devices according to comparative examples.

DETAILED DESCRIPTION

Figure 1A:
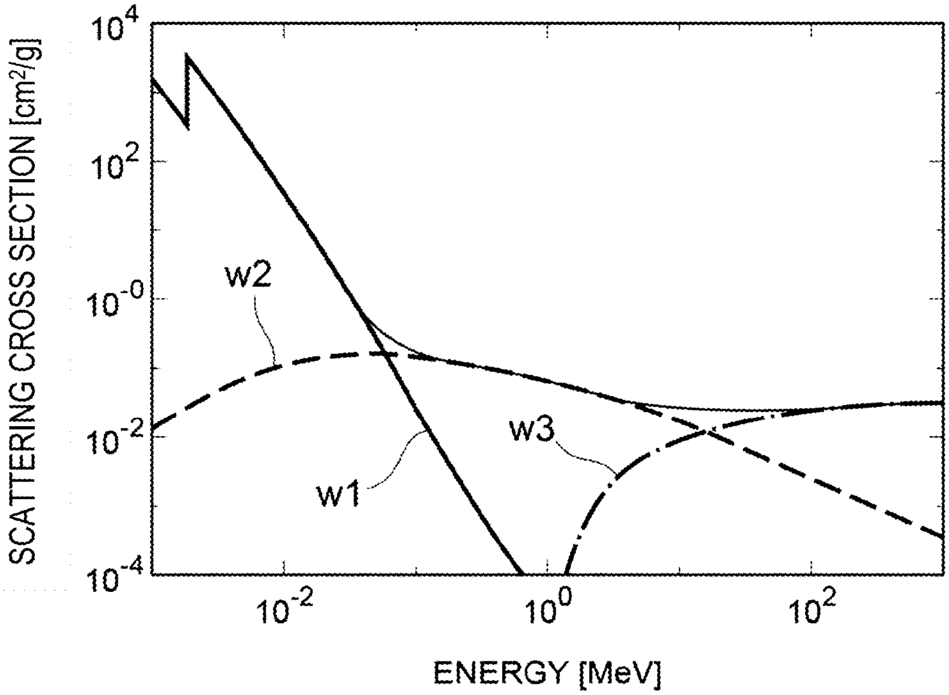
FIG. 1A is a diagram illustrating a relationship between energy of gamma rays and a scattering cross section.

Embodiments provide a radiation detection device and a semiconductor memory device having excellent gamma ray detection sensitivity and capable of being miniaturized and achieving low power consumption, and a radiation detection method using the same.

In general, according to one embodiment, a radiation detection device includes a non-volatile memory chip including a plurality of stacked memory cells, and a controller configured to detect gamma rays incident on the non-volatile memory chip during a gamma ray detection window according to a data inversion and a threshold voltage change of at least some of the memory cells in the non-volatile memory chip during the gamma ray detection window.

Hereinafter, embodiments of a radiation detection device, a semiconductor memory device, and a radiation detection method will be described with reference to the drawings. In the following, main configuration parts of the radiation detection device and the semiconductor memory device are mainly described. It should be noted that the radiation detection device and the semiconductor memory device include configuration parts and functions not illustrated or described therein. The intended scope of the following disclosure does not exclude configuration parts or functions not illustrated or described.

Principle of Radiation Detection

A cosmic ray is a high-energy elementary particle that falls from the cosmos and has a wide energy distribution. A physical process related to the generation of the cosmic ray has not been elucidated, and many research studies are being conducted for the purpose of finding a celestial body that is the origin of the cosmic ray and knowing the birth of the cosmos.

In addition to a particle having an electric charge such as a proton and an electron (hereinafter, referred to as a charged particle), a cosmic ray includes an elementary particle that does not have an electric charge such as a gamma ray. Since a charged particle cannot travel straight in the outer space due to influence of a magnetic field, a generation position of the charged particle cannot be found based on observation. Meanwhile, since an elementary particle that does not have an electric charge such as a gamma ray can travel straight without being affected by a magnetic field, a position of the generation source can be found by detecting the gamma ray. Gamma ray observation is performed for the purpose of finding a new celestial body and elucidating mystery of birth of the cosmos, and several gamma ray detectors are being developed.

A gamma ray detector of the related art detects electron-hole pairs generated when gamma rays collide with a semiconductor such as silicon and CdTe. However, in order to increase a probability of gamma ray collision with the semiconductor, a thickness of the semiconductor has to be increased, which causes the gamma ray detector to become larger. In addition, since the gamma ray can be detected only while the gamma ray detector is powered on, power consumption of the gamma ray detector increases. For example, when an astronaut performs extravehicular activity in an environment such as the International Space Center where the atmosphere is thin, there is a risk of explosion in a large amount of cosmic rays including gamma rays due to the thin atmosphere. Accordingly, the astronaut needs to constantly carry a detector for cosmic rays such as gamma rays when performing the extravehicular activity, and miniaturization and low power consumption are required.

A radiation detection device according to the present embodiment is characterized in that the radiation detection device can detect gamma rays with high accuracy without consuming too much power while using the existing non-volatile memory chips. The non-volatile memory chips are diced after a memory cell structure is formed on a semiconductor wafer, and a thickness of a single memory cell is less than 1 μm. However, in recent flash memory chips, a storage capacity has increased significantly by stacking memory cells, and thicknesses of memory cell portions of the flash memory chips have become thicker as the number of stacked memory cells has increased. The radiation detection device according to the present embodiment employs non-volatile memory chips having a three-dimensional structure in which memory cells are stacked, for detecting gamma rays.

When gamma rays are incident on memory cells in a non-volatile memory chip, secondary electrons due to an effect known as Compton scattering may be generated in the memory cells. The generated secondary electrons become a factor that changes threshold voltages of the memory cells. When the threshold voltages of the memory cells change, data stored in the non-volatile memory chip is inverted. Thus, when it is detected that the data stored in the non-volatile memory chip is inverted, collision of the gamma rays with the memory cells can be detected. Since the non-volatile memory chip includes many memory cells, the dose of gamma rays can be detected by detecting the number of memory cells in which data is inverted.

Here, characteristics of gamma rays are described. When gamma rays are incident on a material, there is a photoelectric effect, Compton scattering, or electron-positron pair generation. The photoelectric effect is an interaction between gamma rays and electrons bound to atoms in a material, and as a result of the interaction, the total energy of gamma rays is absorbed by the atoms in the material and photoelectrons are emitted from the atoms. The Compton scattering occurs when gamma rays collide with free electrons in a material. When energy of the gamma rays is 100 keV to several MeV, the electrons bound to the atoms in the material can be regarded as free electrons, and collision with the gamma rays changes the direction and the energy of the gamma rays, and part of the incident energy of the gamma rays is applied to the electrons. The electron-positron pair generation indicates conversion of gamma rays into electron-positron pairs. When the energy of the gamma rays is less than 100 keV, the photoelectric effect occurs, and when the energy of the gamma rays is 100 keV to several MeV, the Compton scattering occurs, and when the energy of the gamma rays exceeds several MeV, the electron-positron pair generation occurs.

Figure 1B:
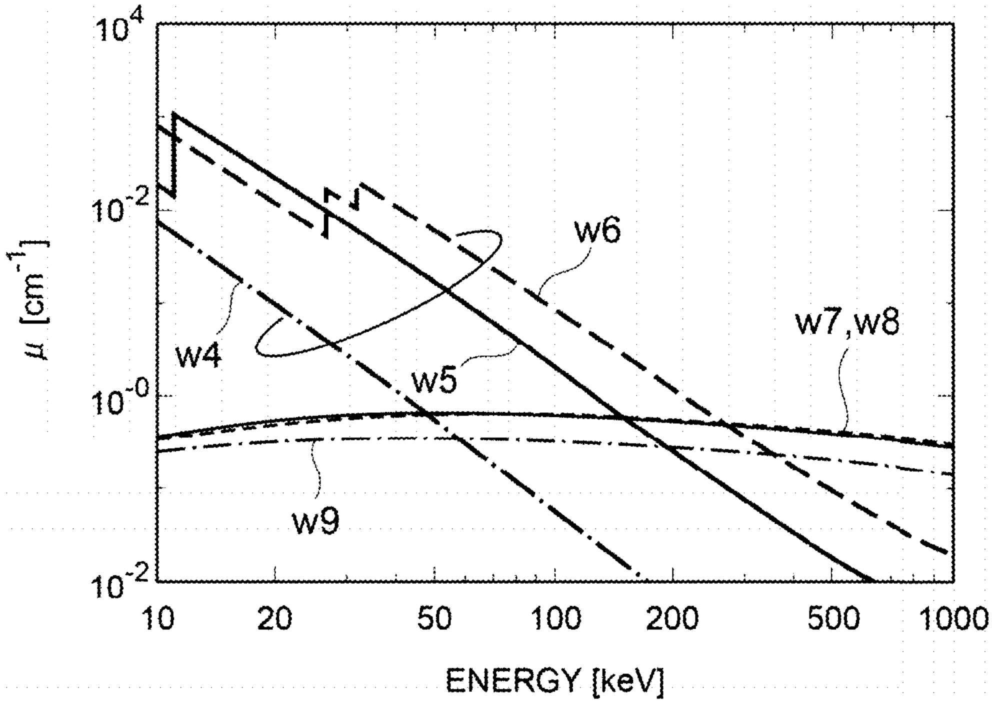
FIG. 1B is a diagram illustrating a relationship between the energy of gamma rays and an attenuation coefficient.

FIGS. 1A and 1B are diagrams illustrating the behavior of gamma rays in silicon. FIG. 1A illustrates a relationship between the energy of gamma rays and a scattering cross section, and FIG. 1B illustrates a relationship between the energy of gamma rays and an attenuation coefficient. Horizontal axes of FIGS. 1A and 1B are both energy [MeV] of gamma rays. A vertical axis of FIG. 1A is the scattering cross section [$cm^2/g$], and a vertical axis of FIG. 1B is the attenuation coefficient μ [$cm^{-1}$].

As illustrated in FIG. 1A, when the energy of gamma rays is small, a photoelectric effect occurs (waveform w1), and when the energy is 100 keV to several MeV, Compton scattering occurs (waveform w2), and when the energy exceeds several MeV, electrons-positron pair generation occurs (waveform w3). As can be seen from the waveform w2, in the Compton scattering, the scattering cross section does not change much even when the energy of gamma rays changes.

The attenuation coefficient in FIG. 1B is obtained by multiplying the scattering cross section by density. FIG. 1B illustrates a state (waveforms w4 to w6) in which attenuation coefficients of silicon, germanium, and CdTe change due to a photoelectric effect of gamma rays, and a state (waveforms w7 to w9) in which attenuation coefficients of silicon, germanium, and CdTe change due to Compton scattering of gamma rays.

As can be seen from FIG. 1B, attenuation coefficients due to the photoelectric effect decrease as the energy of gamma rays increases (waveforms w4 to w6), whereas attenuation coefficients due to the Compton scattering change very little even when the energy of gamma rays changes (waveforms w7 to w9).

When gamma rays are incident on a material and cause the Compton scattering, secondary electrons are generated. The generated secondary electrons generate pairs of electrons and holes. In a non-volatile memory chip having a type of memory cells that store electric charges in a charge storage film, when secondary electrons are generated by the Compton scattering in the memory cells, the electric charges enter the charge storage film due to the effect and data is inverted.

Further, recent non-volatile memory cells store multi-value data by setting a plurality of threshold voltages having different voltage levels. When secondary electrons are generated in a memory cell due to the Compton scattering of gamma rays, a threshold voltage of the memory cell changes. When the threshold voltage changes, at least some bits of data consisting of multi-value bits are inverted.

As such, when gamma rays cause Compton scattering in memory cells of a non-volatile memory chip, secondary electrons are generated, and thus, data in the memory cells is inverted or threshold voltages change. Thus, when data of all the memory cells of the non-volatile memory chip is read and inversion of the data is detected, it can be determined that the inversion is caused by gamma rays. Further, dose of gamma rays can also be estimated from the number of memory cells having inverted data.

First Embodiment

Hereinafter, a radiation detection device, a semiconductor memory device, and a radiation detection method according to the first embodiment are described in detail.

Figure 2:
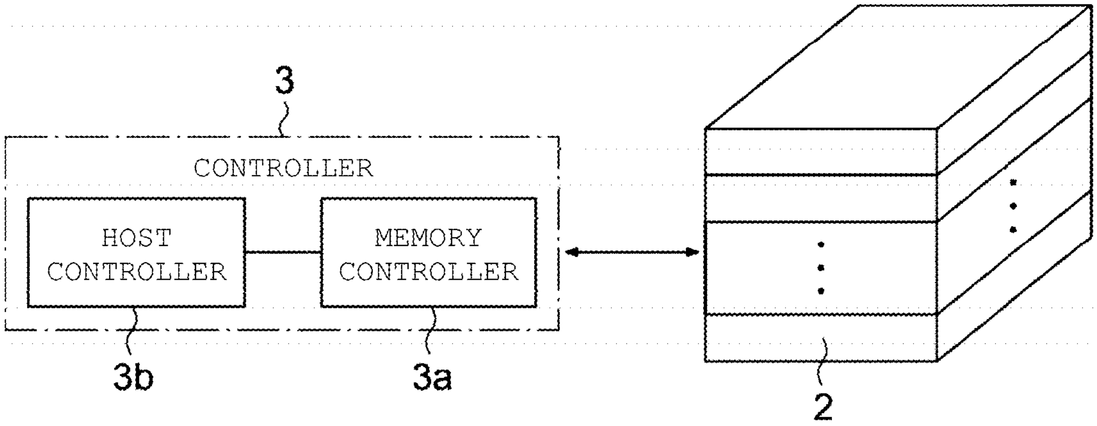
FIG. 2 is a block diagram of a radiation detection device according to a first embodiment.

FIG. 2 is a block diagram of a radiation detection device 1 according to the first embodiment. The radiation detection device 1 according to the present embodiment includes non-volatile memory chips 2 and a controller 3. The non-volatile memory chips 2 and the controller 3 may be included in the same package or may be included in separate packages to be mounted on supporting substrates. Further, the supporting substrate on which the non-volatile memory chips 2 are mounted and the supporting substrate on which the controller 3 is mounted may be separately provided, and these supporting substrates may be connected to each other by a wire cable such as a flexible printed circuit (FPC).

The non-volatile memory chips 2 are used to detect gamma rays included in cosmic rays that are around the radiation detection device 1. In order for the non-volatile memory chips 2 to detect gamma rays, the gamma rays need to collide with free electrons to cause Compton scattering in memory cells in the non-volatile memory chips 2.

Accordingly, it is desirable that the non-volatile memory chips 2 have a structure in which gamma rays are likely to cause the Compton scattering.

For example, the non-volatile memory chips 2 are desirably thick from the viewpoint of increasing a probability that gamma rays cause the Compton scattering. In the present embodiment, it is assumed that general-purpose non-volatile memory chips 2 such as flash memory chips are used. The general-purpose non-volatile memory chips 2 are made by dicing a semiconductor wafer and each have a thickness of less than a several μm, and thus, the above-described probability cannot be increased.

Therefore, in the present embodiment, a non-volatile memory chip 2 having a three-dimensional structure in which a plurality of memory cells are stacked is used as one candidate of the non-volatile memory chips 2. Since the plurality of memory cells are stacked, the non-volatile memory chip 2 having a three-dimensional structure is thicker than the non-volatile memory chip 2 in which the memory cells are arranged on a two-dimensional plane. A thickness of a memory cell portion of the non-volatile memory chip 2 having a three-dimensional structure, which depends on the number of stacked memory cells, is about 5 μm, and is approximately several tens of μm when the thickness includes a thickness of a substrate or a wiring layer.

Even with a single non-volatile memory chip 2 having a three-dimensional structure, a probability that gamma rays cause Compton scattering can be increased as compared with the non-volatile memory chip 2 in which memory cells are arranged on a two-dimensional plane. However, in order to further increase the probability that the gamma rays cause the Compton scattering, it is desirable to use a memory module in which a plurality of non-volatile memory chip 2 having a three-dimensional structure are vertically stacked. Thereby, the probability that the gamma rays cause the Compton scattering in at least one non-volatile memory chip 2 in the first memory module can be further increased.

Figure 3A:
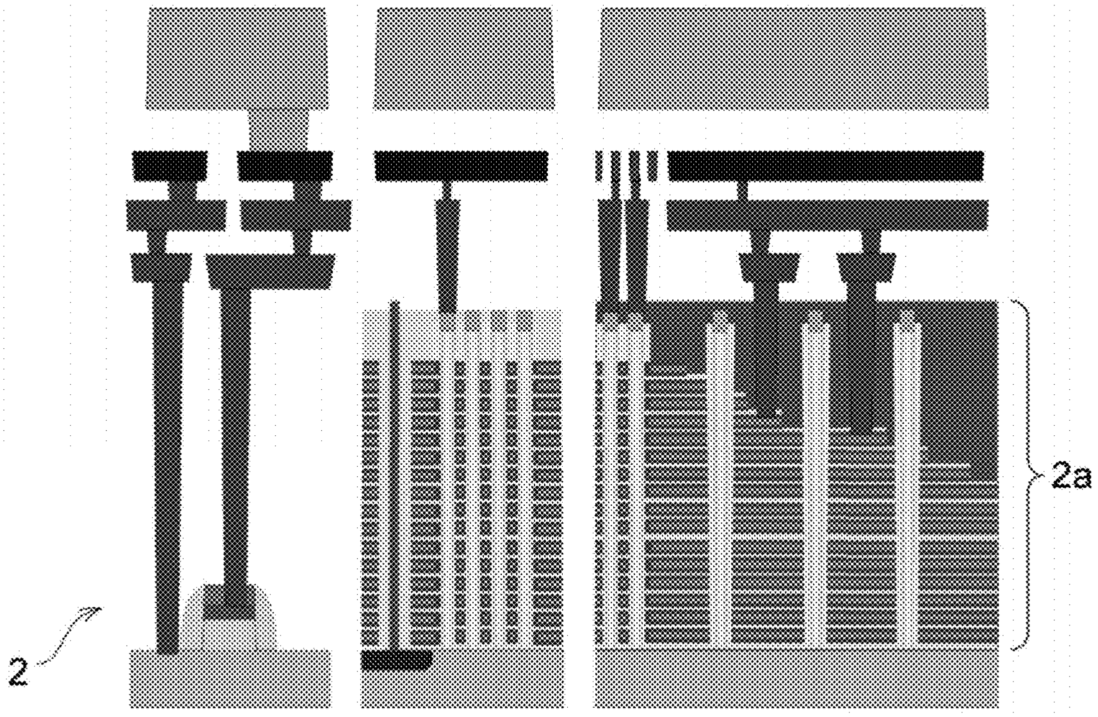
FIG. 3A is a schematic cross-sectional view of a non-volatile memory chip having a three-dimensional structure.
Figure 3B:
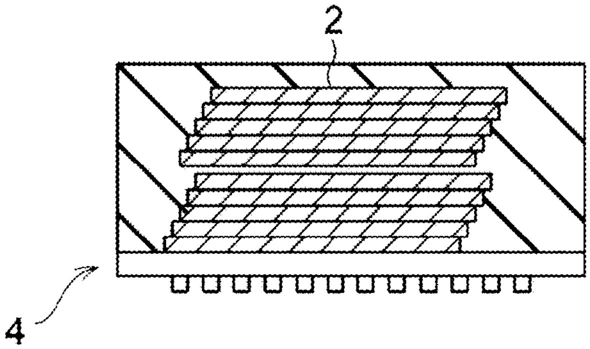
FIG. 3B is a schematic cross-sectional view of a first memory module in which a plurality of non-volatile memory chips are stacked.

FIG. 3A is a schematic cross-sectional view of the non-volatile memory chip 2 having a three-dimensional structure, FIG. 3B is a schematic cross-sectional view of a first memory module 4 in which a plurality of non-volatile memory chips 2 are stacked. FIG. 3B illustrates an example of the first memory module 4 in which ten non-volatile memory chips 2 having the cross-sectional structure of FIG. 3A are stacked and sealed, and the number of the non-volatile memory chips 2 in the first memory module 4 may be any plural number.

Assuming that a thickness of a memory cell portion 2*a* of the non-volatile memory chip 2 having a three-dimensional structure is, for example, 5 μm and ten non-volatile memory chips 2 are stacked in the first memory module 4, the thickness of the memory cell portion 2*a* in the first memory module 4 is about 50 μm.

Figure 3C:
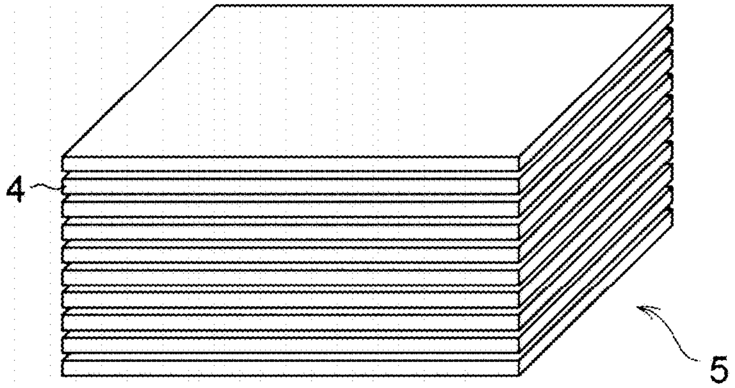
FIG. 3C is a view illustrating a second memory module in which a plurality of first memory modules are stacked.

It cannot be certain that there is a high probability that gamma rays cause Compton scattering in the thickness of about 50 μm. Therefore, as illustrated in FIG. 3C, a second memory module 5 in which a plurality of the first memory modules 4 of FIG. 3B are stacked may be provided. The number of the first memory modules 4 in the second memory module 5 may be any plural number. For example, when ten first memory modules 4 are stacked to manufacture the second memory module 5, the thickness of the memory cell portion 2*a* of the second memory module 5 is about 500 μm. When the thickness of the memory cell portion 2*a* is about 500 μm, a probability that gamma rays cause the Compton scattering in any of the memory cells increases, and sufficient performance as a radiation detector can be obtained.

Since the memory cell portion 2*a* of the non-volatile memory chip 2 having a three-dimensional structure has the thickness of about 5 μm as described above, the probability that gamma rays cause the Compton scattering in one non-volatile memory chip 2 is about 0.01%. However, by providing the first memory module 4 in which ten non-volatile memory chips 2 are stacked as illustrated in FIG. 3B, and further, by stacking ten first memory modules 4 as illustrated in FIG. 3C, the probability that gamma rays cause the Compton scattering in a memory cell can be increased to about 1%.

In FIG. 3C, a plurality of the first memory modules 4 which are simply stacked are used as the second memory module 5, but a plurality of first memory modules 4 which are stacked and packaged may be used as the second memory module 5. Thereby, the second memory module 5 can be handled as one semiconductor device.

Data in each non-volatile memory chip 2 of the second memory module 5 can be read by the controller 3. When gamma rays incident on the second memory module 5 cause the Compton scattering in at least one memory cell in the second memory module 5, two-dimensional electrons are generated and data in the memory cell is inverted, and thus, the controller 3 can detect the gamma rays. Here, inversion of data indicates that, when the data is one bit, the bit is inverted, and when the data is a multi-value bit, at least one bit is inverted.

When the number of stacked memory cells in the non-volatile memory chip 2 having a three-dimensional structure can be increased to more than 100 layers, it is not always necessary to provide the first memory module 4 and the second memory module 5. With only a single non-volatile memory chip 2 having a three-dimensional structure and more than 100 layers, a probability that gamma rays cause the Compton scattering may be set to a desired value. Thus, in the radiation detection device 1 according to the present embodiment, the first memory module 4 and the second memory module 5 are not always essential.

The controller 3 of FIG. 2 detects at least one of data inversion and a threshold voltage change caused by Compton scattering of gamma rays traveling in a stacking direction of a plurality of memory cells in at least some of the memory cells.

Further, when the radiation detection device 1 includes the first memory module 4 in which a plurality of non-volatile memory chips 2 are stacked, the controller 3 detects at least one of the data inversion and the threshold voltage change, which are caused by the Compton scattering of gamma rays in the memory cells, from at least some of the non-volatile memory chips 2 in the first memory module 4.

Furthermore, when the radiation detection device 1 includes the second memory module 5 in which a plurality of first memory modules 4 are stacked, the controller 3 detects at least one of the data inversion and the threshold voltage change caused by the Compton scattering in at least some of the memory cells in the second memory module 5.

The controller 3 in FIG. 2 includes a memory controller 3*a* and a host controller (also referred to as a host computer) 3*b*. The memory controller 3*a* controls write and read of data to and from the non-volatile memory chip 2. The host controller 3*b* detects at least one of data inversion and a threshold voltage change of at least some of the memory cells in the non-volatile memory chip 2 due to incident gamma rays. The memory controller 3*a* and the host controller 3*b* may be integrated into one. Further, when the memory controller 3*a* and the host controller 3*b* are provided separately, for example, the memory controller 3*a* and the non-volatile memory chip 2 are mounted on the same supporting substrate, the host controller 3*b* is mounted on another supporting substrate, and both supporting substrates may transmit and receive signals through a wire cable such as a flexible printed circuit (FPC).

Figure 4:
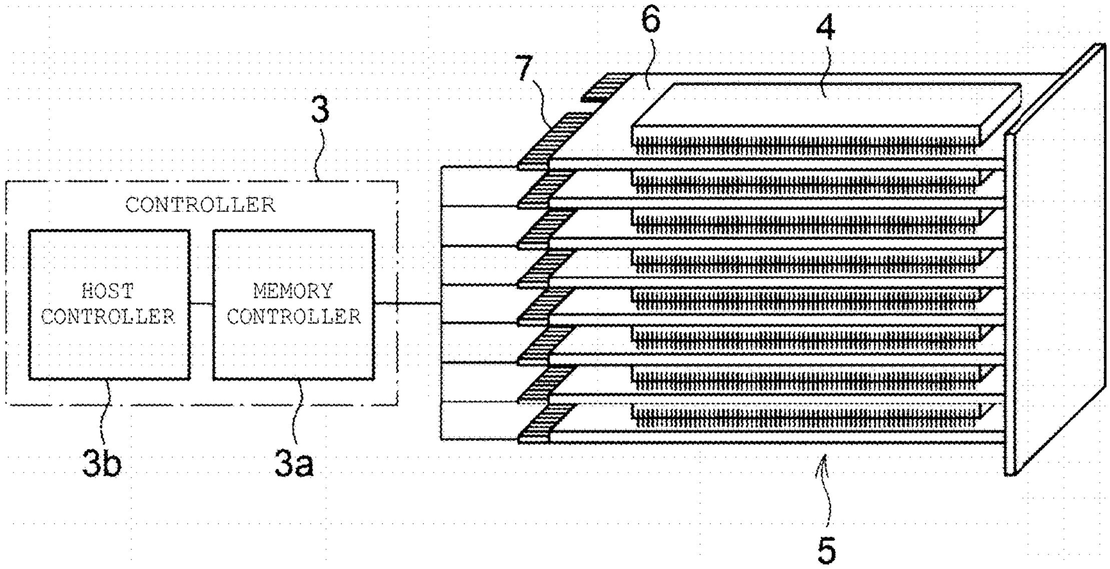
FIG. 4 is a view illustrating data transmission and reception between the second memory module and a controller.

FIG. 4 is a view illustrating data transmission and reception between the second memory module 5 and the controller 3. The second memory module 5 is obtained by stacking a plurality of first memory modules 4, each of which includes a plurality of non-volatile memory chips 2 stacked on a supporting substrate 6 and sealed. The supporting substrate 6 in each of the plurality of first memory modules 4 includes an interface unit 7. The controller 3 can erase all memory cells in the plurality of first memory modules 4 and read data of all the memory cells via the interface unit 7 of each of a plurality of the supporting substrates 6. Pin arrangement, a pin shape, or the like of the interface unit 7 are not limited to those illustrated in FIG. 4.

Figure 5:
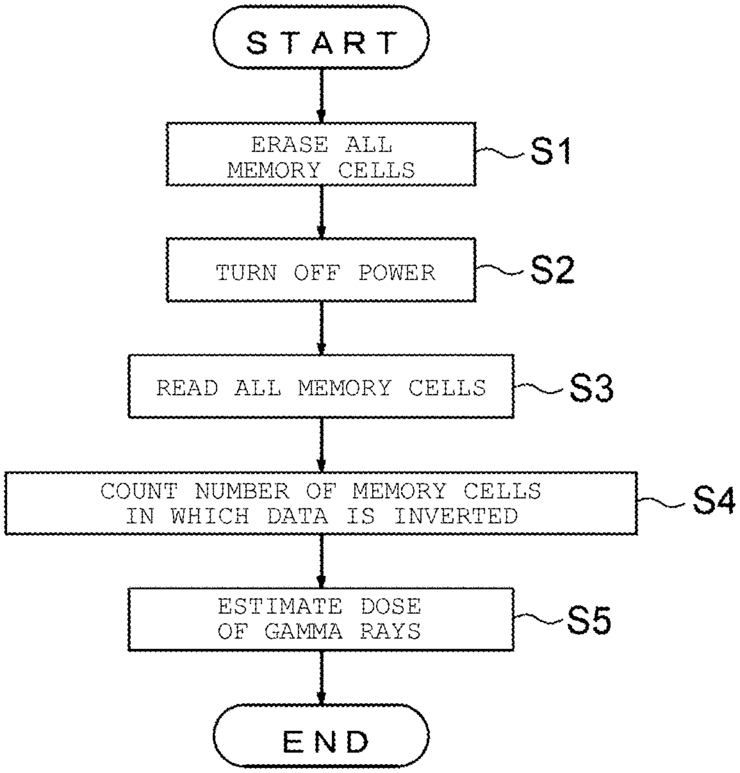
FIG. 5 is a flowchart illustrating a processing operation performed by the controller of the radiation detection device according to the present embodiment.

FIG. 5 is a flowchart illustrating a processing operation performed by the controller 3 of the radiation detection device 1 according to the present embodiment. First, all memory cells in all the non-volatile memory chips 2 are erased (step S1). When the non-volatile memory chip 2 is a flash memory, the non-volatile memory chip 2 performs an operation of removing all electric charges stored in a charge storage film. In the present specification, data in an erased state is described as 1. By removing electric charges from the charge storage film in each memory cell, a threshold voltage of each memory cell is reduced.

When all memory cells in all the non-volatile memory chips 2 are in the erased state, power of the radiation detection device 1 is turned off (step S2). The radiation detection device 1 according to the present embodiment can detect gamma rays without using power. When power of the radiation detection device 1 is turned off, the power is not supplied to the non-volatile memory chips 2, and no power consumption occurs. When gamma rays are incident on the non-volatile memory chips 2 in this state, Compton scattering of gamma rays may occur in at least some of the memory cells. When the Compton scattering occurs, secondary electrons are generated, electric charges are stored in the charge storage film in the memory cell, and data is inverted. The operation described above is performed in a state where power is not supplied to the non-volatile memory chips 2, that is, without consuming power.

As described above, the radiation detection device 1 according to the present embodiment has excellent characteristics that gamma rays can be detected and the detected state can be stored in the memory cell without consuming power.

Thereafter, when the power of the radiation detection device 1 is turned on at an appropriate timing, the controller 3 reads data of all the memory cells in all the non-volatile memory chips 2 (step S3). Since all the memory cells are in the erased state in step S1 described above, all data should be 1. When data of all the memory cells is read in step S3, if the data 0 is read, the controller 3 determines that the data 0 is due to Compton scattering of gamma rays. In the case of multi-value data, all bits are 1 in the erased state, and at least one bit changes to 0 when the gamma rays are detected.

In theory, data stored in a non-volatile memory can be inverted due to a factor (for example, aging) other than the Compton scattering of gamma rays. However, when the elapsed time from erasing memory cells is not so long, there is not sufficient time for data to be inverted as a result of aging. Thus, a case where data is inverted within a few hours or few days after erasing the memory cells can be concluded as being due to Compton scattering of gamma rays.

The controller 3 counts the number of memory cells in which data is inverted (step S4). When the dose of gamma rays is increased, the gamma rays are likely to cause increased Compton scattering, and the number of memory cells in which data is inverted is increased. Thus, the dose of gamma rays can be estimated from the number of memory cells in which data is inverted (step S5).

As described above, when about 100 layers of memory cells are stacked by using the non-volatile memory chips 2 having a three-dimensional structure, a probability that gamma rays cause Compton scattering is about 1%. Thus, a table may be prepared in advance such that the dose of gamma rays can be quickly estimated from the number of stacked memory cells and the number of memory cells in which data is inverted. This table outputs the dose of gamma rays with the number of stacked memory cells and the number of memory cells having inverted data as input parameters. The above-described table can be generated in advance based on a result of an experiment or a simulation that determines the frequency of data inversion by irradiating the non-volatile memory chip 2 of a sample with gamma rays of a known dose.

FIG. 6 is a diagram illustrating a comparison between the radiation detection device 1 according to the present embodiment and radiation detection devices according to first to third comparative examples.

Since the radiation detection device 1 according to the present embodiment includes, for example, 100 stacked memory cells as described above, and thus, a thickness of the memory cell portion 2*a* is about 500 μm. A pixel pitch is 0.2 μm, the number of pixels is 32 k×1 k (32 Megapixels), and an area of a pixel area is 1 $cm^2$ or more. An occurrence rate of Compton scattering of gamma rays per memory cell is about 0.01%, and the occurrence rate of the Compton scattering of gamma rays is about 1% when 100 memory cells are stacked. As described above, the radiation detection device 1 according to the present embodiment can detect gamma rays without using any power.

A radiation detection device according to a first comparative example is a silicon on insulator (SOI) type silicon detector in which gamma rays generate Compton scattering in a silicon layer having an SOI structure. A thickness of the silicon layer is about 500 μm, a pixel pitch is 6 μm, the number of pixels is 600×300 pixels, and an area of one pixel is 2 $cm^2$ or more. An occurrence rate of Compton scattering of gamma rays in the silicon layer is about 1%. The radiation detection device according to the first comparative example needs to supply power to a detection device while detecting the gamma rays.

A radiation detection device according to a second comparative example is a silicon-strip type detection device. A thickness of a silicon layer is about 100 μm, and a pixel pitch is 400 μm. An occurrence rate of Compton scattering of gamma rays in the silicon layer is about 1%. The radiation detection device according to the second comparative example needs to supply power to a detection device while detecting the gamma rays.

A radiation detection device according to a third comparative example is a CdTe strip type detector in which a signal reading circuit is disposed on the supporting substrate 6 and a CdTe crystal layer is arranged on the signal reading circuit. A thickness of the CdTe crystal layer is about 500 μm, a pixel pitch is about 1 mm, and the number of pixels is 128×128 pixels. A probability that gamma rays cause Compton scattering in the CdTe crystal layer is about 10%. The radiation detection device according to the third comparative example needs to supply power to a detection device while detecting the gamma rays.

As can be seen from a comparison result of FIG. 6, in the radiation detection device 1 according to the present embodiment, the thickness of the memory cell portion 2*a* capable of detecting gamma rays is approximately the same as the thickness of the memory cell portion 2*a* of each of the first to third comparative examples, and detection sensitivity of gamma rays is also inferior to the detection sensitivity of gamma rays in the third comparative example, but is approximately the same as the detection sensitivity of gamma rays in the first and second comparative examples. The radiation detection devices according to the first to third comparative examples have to be powered during detection of gamma rays, whereas the radiation detection device 1 according to the present embodiment can detect gamma rays in a state where power is turned off and store a detection result of the gamma rays without supplying power. Further, since the radiation detection devices according to the first to third comparative examples have a unique layer structure for detecting gamma rays, a high cost is required to manufacture the radiation detection device 1. In contrast to this, the radiation detection device 1 according to the present embodiment can detect gamma rays by using the existing non-volatile memory chip 2 having a three-dimensional structure as it is, and thus, the radiation detection device 1 is superior to the radiation detection devices according to the first to third comparative examples in terms of cost, reliability, and mass productivity.

The radiation detection device 1 according to the present embodiment can be implemented by a semiconductor memory device including the non-volatile memory chip 2. In this case, the semiconductor memory device has the same block configuration as in FIG. 1. The controller 3 has a function of alternatively selecting a first mode using the non-volatile memory chip 2 for writing and reading certain data, and a second mode using the non-volatile memory chip 2 for detecting gamma rays.

When the controller 3 selects the first mode, the non-volatile memory chip 2 is used in the same manner as a normal non-volatile memory under a control of the controller 3. When the controller 3 selects the second mode, the controller 3 performs the processing operation illustrated in FIG. 5.

Thereby, although having the same hardware configuration as the existing semiconductor memory device, the semiconductor memory device can be used not only for storing data but also for detecting gamma rays as necessary.

In addition to a flash memory, various types of non-volatile memories including memory cells having a three-dimensional structure, such as a magnetoresistive random access memory (MRAM), a phase change RAM (PRAM), and a resistive RAM (ReRAM) may be applied as the non-volatile memory chip 2 used in the present embodiment.

As such, in the first embodiment, the radiation detection device 1 is configured with the non-volatile memory chip 2 having a three-dimensional structure. After erasing all the memory cells in the non-volatile memory chips 2, power of the radiation detection device 1 is turned off. When gamma rays are incident on the non-volatile memory chip 2 while power of the radiation detection device 1 is turned off, Compton scattering may occur in the memory cells and secondary electrons may be generated. When the secondary electrons are generated, electric charges enter a charge storage film of the memory cell, and thus, data inversion or a threshold voltage change occurs. Once the data inversion or the threshold voltage change occurs, the memory cell stores the state without power supply.

Thereafter, when the power of the radiation detection device 1 is turned on at an appropriate timing, the controller 3 reads data of all the memory cells in all the non-volatile memory chips 2 and checks whether or not the data is inverted. The controller 3 determines that gamma rays are detected when there is a memory cell in which data is inverted. Further, the controller 3 can estimate dose of gamma rays from the number of memory cells in which data is inverted.

The radiation detection device 1 according to the present embodiment can detect radiation without power consumption by using the existing non-volatile memory chip 2 having a three-dimensional structure as it is.

Second Embodiment

Gamma rays included in cosmic rays are randomly scattered around the radiation detection device 1, and even when it is found that data read by the controller 3 is inverted according to the flowchart of FIG. 5, it is unknown from which direction the gamma rays that cause Compton scattering in the memory cells in the non-volatile memory chip 2 are incident. Therefore, a second embodiment enables not only detection of gamma rays but also detection of an incident direction of gamma rays.

Figure 7:
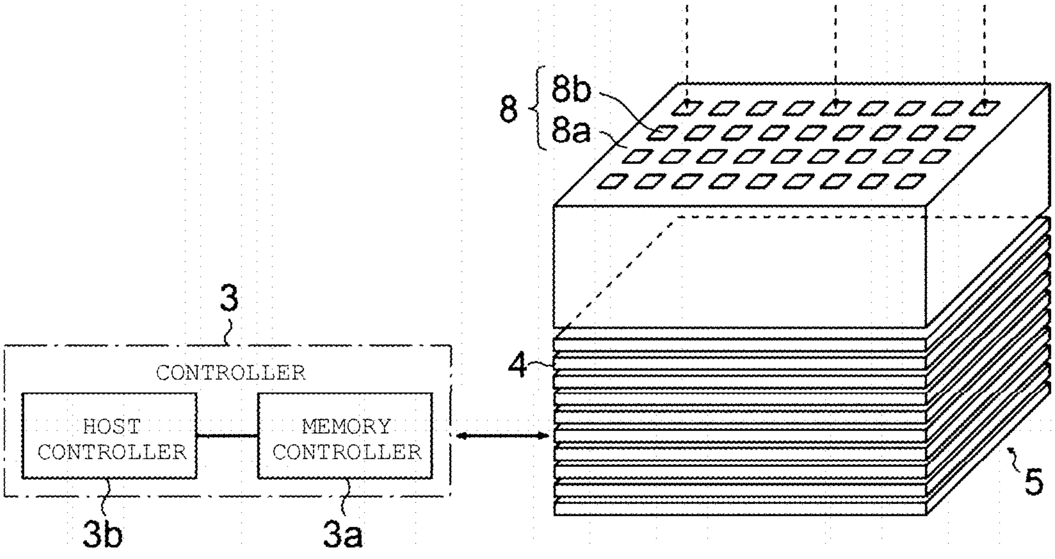
FIG. 7 is a view schematically illustrating a radiation detection device according to a second embodiment.

FIG. 7 is a view schematically illustrating a radiation detection device 1*a* according to the second embodiment. The radiation detection device 1*a* of FIG. 7 includes a collimator 8 disposed on one main surface of a non-volatile memory chip 2. A structure of the non-volatile memory chip 2 is the same as the non-volatile memory chip in the first embodiment. In FIG. 7, the collimator 8 is disposed on one main surface of a second memory module 5 in which the non-volatile memory chips 2 are stacked.

The collimator 8 includes a medium 8*a* that absorbs gamma rays and pinholes 8*b* penetrating the medium 8*a*. Gamma rays penetrating the medium 8*a* via the pinholes 8*b* are incident on one main surface of the non-volatile memory chip 2. In FIG. 7, a plurality of pinholes 8*b* are provided in the medium 8*a*, but the number, shapes, and sizes of the pinholes 8*b* are not limited. Increasing the number of pinholes 8*b* can increase a probability that gamma rays cause Compton scattering. Further, by increasing the sizes of the pinholes 8*b*, the probability that the gamma rays cause the Compton scattering can be increased. However, as the sizes of the pinholes 8*b* are increased, an incident angle range of the gamma rays is widened, and thus, it is difficult to specify incident directions of the gamma rays.

The medium 8*a* is desirably a material capable of absorbing gamma rays such as lead and tungsten. The gamma rays obliquely incident on the medium 8*a* cannot penetrate the pinholes 8*b* and are absorbed by the medium 8*a*. Thereby, only gamma rays penetrating the pinholes 8*b* can be incident on one main surface of the non-volatile memory chip 2. Typically, the pinholes 8*b* are arranged in the normal direction of one main surface of the non-volatile memory chip 2. Thus, the radiation detection device 1*a* according to the present embodiment can detect only gamma rays from the normal direction of one main surface of the non-volatile memory chip 2.

Figure 8:
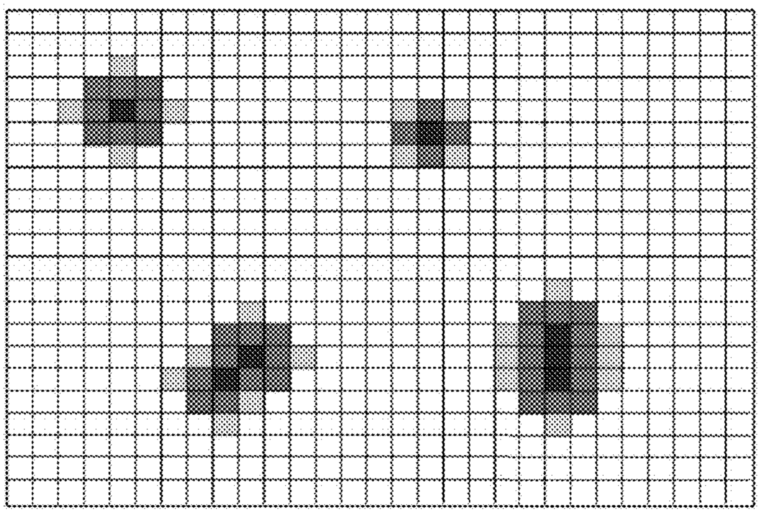
FIG. 8 provides a visualization of a result of reading the data of all memory cells by the controller.

A controller 3 of the radiation detection device 1*a* according to the second embodiment performs the same processing operation as in FIG. 5. FIG. 8 provides a visualization of a result of reading the data of all memory cells by the controller 3. FIG. 8 provides a visualization of the frequency of bit inversion in multi-value data when the multi-value data is written in the non-volatile memory chip 2.

When writing the multi-value data to the non-volatile memory chip 2, each memory cell stores the multi-value data of three or more values by two or more threshold voltages having different voltage levels. When Compton scattering of gamma rays occurs in a memory cell for which multi-value writing is performed, at least one bit of the multi-value data may be inverted. The greater the dose of gamma rays, the greater the number of bits which are inverted.

Each square in FIG. 8 represents one memory cell. In FIG. 8, multi-value data stored in the memory cells is represented in different shades according to the number of inverted bits. Specifically, memory cells having many inverted bits stored therein are displayed darker. When an energy intensity of gamma rays is high, energy of secondary electrons generated by Compton scattering increases, and the number of memory cells in which bits are inverted by the secondary electrons is increased. In such a case, the memory cell having the most bit inversions is the location where scattering occurs, and the number of bit inversions in other memory cells is gradually reduced as the distance from the memory cell having the most bit inversions increases. Comparing a case where an energy intensity of gamma rays is large with a case where the energy intensity is small, the larger the energy intensity, the larger the number of memory cells where bit inversion occurs. In FIG. 8, the memory cells having inverted bits are represented in shades according to the number of inverted bits. That is, the dark memory cell regions in the lower right part of FIG. 8 may have the highest energy intensity of gamma rays.

FIG. 8 provides a visualization of the positions of memory cells where the gamma rays are assumed to cause Compton scattering and energy intensity of the gamma rays. In FIG. 8, the number of inverted bits of memory cells is represented by shades of monochrome. However, the number may be expressed in color and brightness. A specific method of visualization is random.

When it is desirable to detect gamma rays from a specific direction around the radiation detection device 1*a*, all memory cells may be erased in a state where the radiation detection device 1*a* is inclined and then the radiation detection device 1*a* may be in a detectable state such that extending directions of the pinholes 8*b* of the collimator 8 coincide with a specific direction. During detection, it is necessary not to change an inclination direction of the radiation detection device 1*a*. When it is desirable to detect gamma rays separately from a plurality of directions, each time the inclination direction of the radiation detection device 1*a* is changed, it is necessary to erase all the memory cells in the non-volatile memory chip 2 or to perform read before changing a direction such that it is possible to distinguish which direction the gamma ray detection occurs.

As such, in the second embodiment, the collimator 8 is disposed on one main surface of the non-volatile memory chip 2, and the pinholes 8*b* penetrating the medium 8*a* of the collimator 8 are provided, and thus, only the gamma rays penetrating the pinholes 8*b* can be incident on the non-volatile memory chip 2. Thus, the radiation detection device 1*a* according to the present embodiment can detect energy intensity of gamma rays and an incident direction of the gamma rays.

Third Embodiment

The radiation detection devices 1 and 1*a* according to the first and second embodiments described above can be configured with a semiconductor memory device including NAND flash memory chips having a three-dimensional structure. As described above, by manufacturing a first memory module 4 in which NAND flash memory chips are stacked and sealed and by manufacturing a second memory module 5 in which a plurality of the first memory modules 4 are stacked, a radiation detection device which is the same as in FIG. 4 can be provided by a semiconductor memory device including the NAND flash memory chips.

Figure 9:
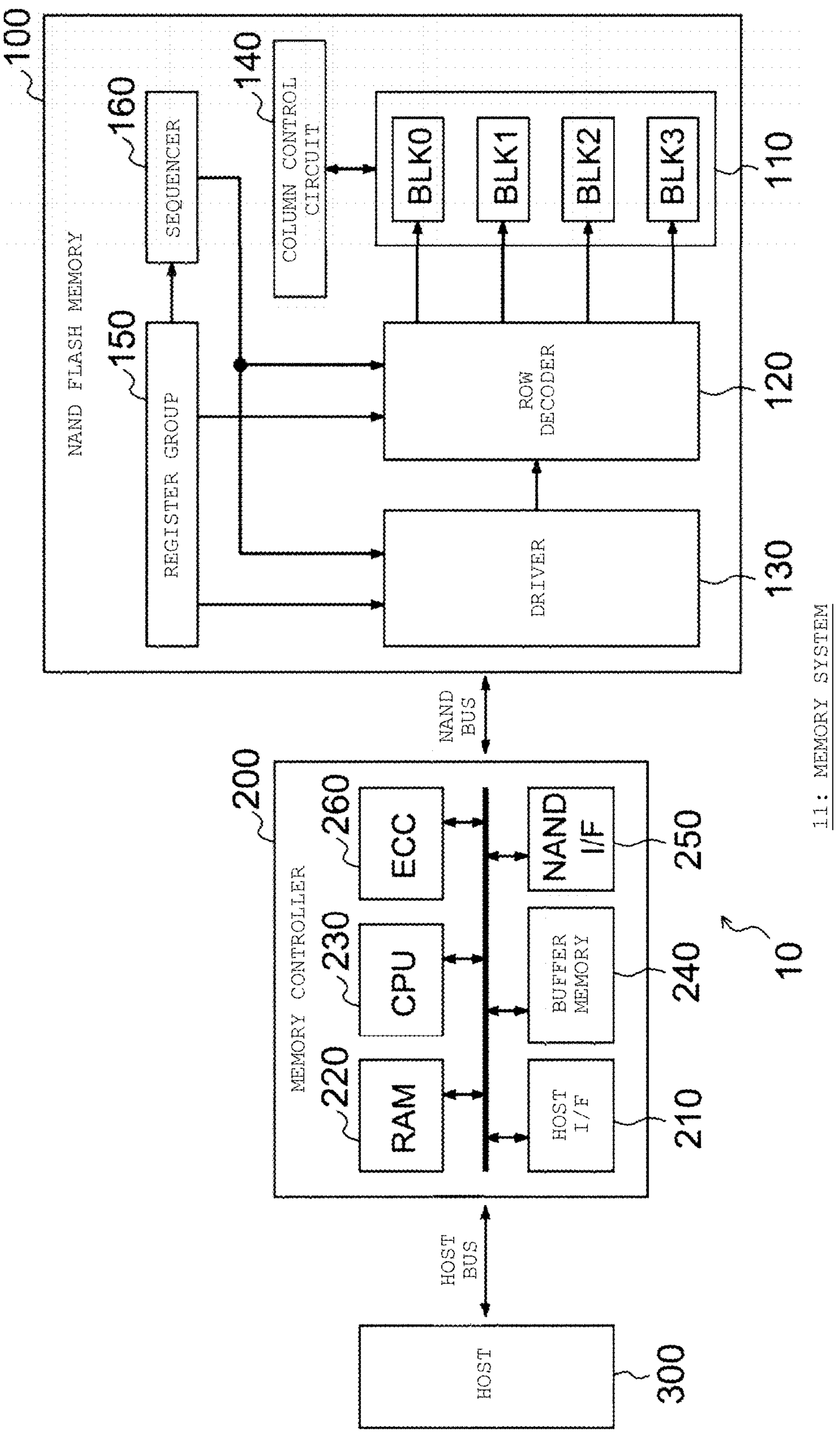
FIG. 9 is a block diagram illustrating a schematic configuration of a semiconductor memory device having a function of the radiation detection device according to the first or second embodiment.

FIG. 9 is a block diagram illustrating a schematic configuration of a semiconductor memory device 10 having functions of the radiation detection devices 1 and 1*a* according to the first and second embodiments, and a memory system 11. The semiconductor memory device 10 of FIG. 9 includes a NAND flash memory 100, a memory controller 200, and a host controller 300. The memory controller 200 and the host controller 300 can be integrated to form one controller 3. The NAND flash memory 100 and the memory controller 200 constitute the semiconductor memory device 10.

The NAND flash memory 100 includes a plurality of memory cells and stores data in a non-volatile manner. The controller 200 is connected to the NAND flash memory 100 through a NAND bus and is connected to the host controller 300 through a host bus. Then, the controller 200 controls the NAND flash memory 100 or accesses the NAND flash memory 100 in response to an instruction received from the host controller 300. The host controller 300 is, for example, an electronic apparatus such as a personal computer, and the host bus is a bus that follows various interfaces including, for example, standard compliance. The NAND bus transmits and receives signals according to a NAND interface such as Toggle IF.

The controller 200 includes a host interface circuit 210, an embedded memory (RAM) 220, a processor (CPU) 230, a buffer memory 240, a NAND interface circuit 250, and an error checking and correcting (ECC) circuit 260.

The host interface circuit 210 is connected to the host controller 300 through the host bus and transmits an instruction and data received from the host controller 300 to the CPU 230 and the buffer memory 240, respectively. Further, in response to an instruction of the CPU 230, data in the buffer memory 240 is transmitted to the host controller 300.

The CPU 230 controls all operations of the controller 200. For example, when receiving a write instruction from the host controller 300, the CPU 230 issues a write instruction to the NAND interface circuit 250 in response thereto. The same applies to read and erase. Further, the CPU 230 performs various processes for managing the NAND flash memory 100, such as wear leveling. An operation of the controller 200 to be described below may be performed by executing firmware by the CPU, or may be performed by hardware.

The NAND interface circuit 250 is connected to the NAND flash memory 100 through the NAND bus and controls communication with the NAND flash memory 100. Then, the NAND interface circuit 250 transmits various signals to the NAND flash memory 100 and receives various signals from the NAND flash memory 100, based on instructions received from the CPU 230. The buffer memory 240 temporarily stores write data and read data.

The RAM 220 is a semiconductor memory such as DRAM or SRAM and is used as a work region of the CPU 230. Then the RAM 220 stores firmware for managing the NAND flash memory 100, various management tables, and the like.

The ECC circuit 260 performs error detection and error correction processing on data stored in the NAND flash memory 100. That is, the ECC circuit 260 generates an error correction code when writing data, adds the error correction code to the written data, and decodes the error correction code when reading the data.

Next, a configuration of the NAND flash memory 100 will be described. FIG. 9 is a block diagram of the memory system 11 including the NAND flash memory 100. As illustrated in FIG. 9, the NAND flash memory 100 includes a memory cell array 110, a row decoder 120, a driver circuit 130, a column control circuit 140, a register group 150, and a sequencer 160.

The memory cell array 110 includes a plurality of block BLKs including a plurality of non-volatile memory cells correlated with rows and columns. In FIG. 9, four blocks BLK0 to BLK3 are illustrated as an example. Then the memory cell array 110 stores data applied by the controller 200.

The row decoder 120 selects one of the blocks BLK0 to BLK3, and further selects a row direction in the selected block BLK. The driver circuit 130 supplies a voltage to the selected block BLK via the row decoder 120.

When reading data, the column control circuit 140 senses data read from the memory cell array 110 and performs necessary operations. Then, the data DAT is output to the controller 200. When writing data, the write data DAT received from the controller 200 is transmitted to the memory cell array 110.

The register group 150 includes an address register, a command register, or the like. The address register stores an address received from the controller 200. The command register stores a command received from the controller 200.

The sequencer 160 controls all operations of the NAND flash memory 100 based on various types of information stored in the register group 150.

Figure 10:
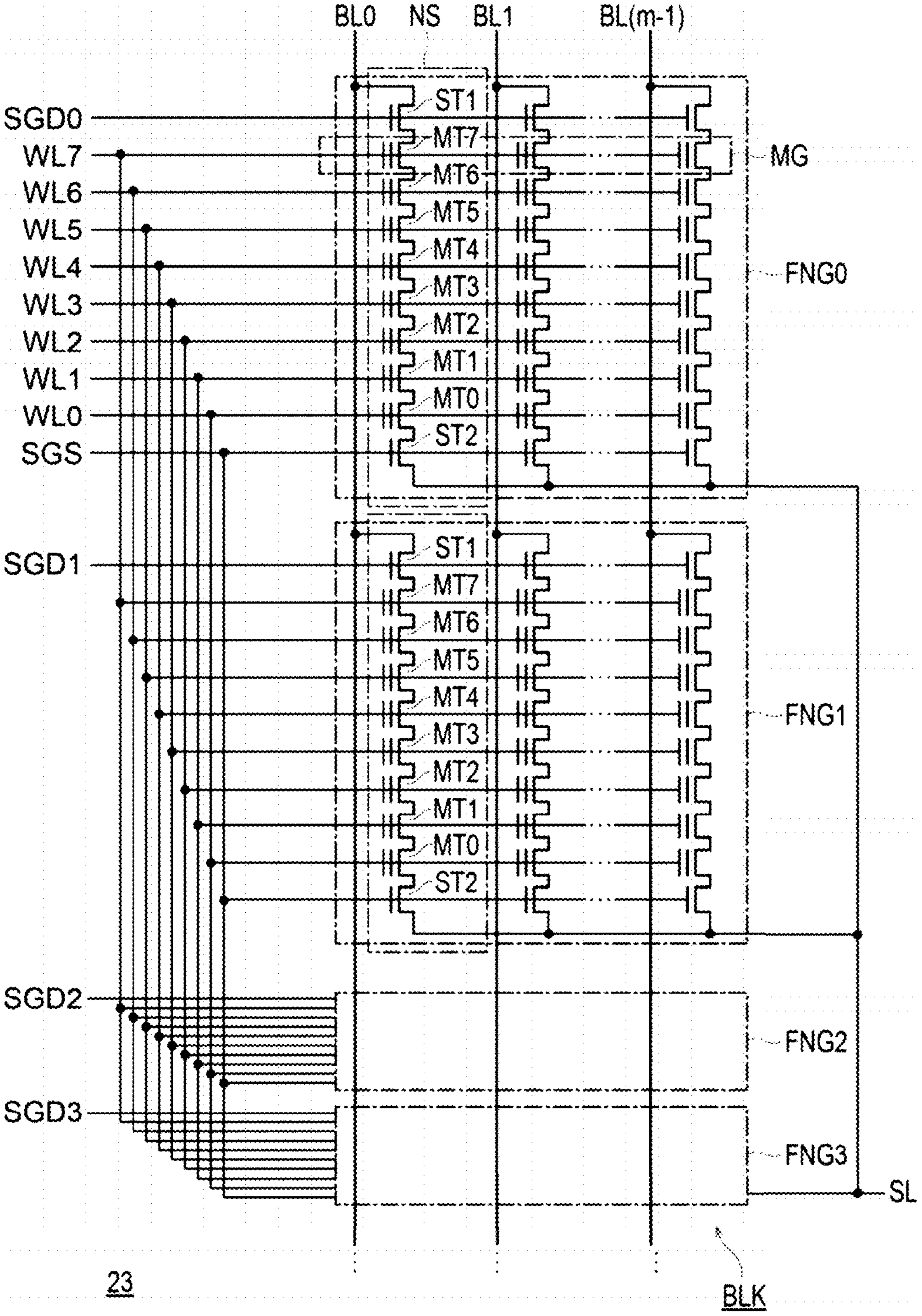
FIG. 10 is a circuit diagram illustrating an example of a NAND flash memory cell array having a three-dimensional structure.

FIG. 10 is a circuit diagram illustrating an example of a NAND flash memory cell array 110 having a three-dimensional structure. FIG. 10 illustrates the circuit configuration of one block BLK among the plurality of blocks in the NAND flash memory cell array 110 having a three-dimensional structure. The other blocks of the NAND flash memory cell array 110 also have the same circuit configuration as in FIG. 10. The present embodiment can also be applied to a memory cell having a two-dimensional structure.

As illustrated in FIG. 10, the block BLK includes, for example, four fingers FNG (FNG0 to FNG3). Further, each finger FNG includes a plurality of NAND strings NS. Each of the NAND strings NS includes, for example, eight memory cell transistors MT (MT0 to MT7) connected in series, and select transistors ST1 and ST2. In the present specification, each finger FNG may be referred to as a string unit SU.

The number of memory cell transistors MT in the NAND string NS is not limited to 8. The memory cell transistors MT are disposed between the select transistors ST1 and ST2 to connect current paths thereof in series. A current path of a memory cell transistor MT7 on one end side of the series connection is connected to one end of a current path of the select transistor ST1, and a current path of a memory cell transistor MT0 on the other end side thereof is connected to one end of a current path of the select transistor ST2.

Gates of the select transistors ST1 of the fingers FNG0 to FNG3 are commonly and respectively connected to select gate lines SGD0 to SGD3. Meanwhile, gates of the select transistors ST2 are commonly connected to the same select gate line SGS among the plurality of finger FNGs. Further, control gates of the memory cell transistors MT0 to MT7 in the same block BLK are commonly and respectively connected to word lines WL0 to WL7. That is, the word lines WL0 to WL7 and the select gate line SGS are commonly connected between the plurality of fingers FNG0 to FNG3 in the same block BLK, whereas the select gate line SGD is independent for each of the fingers FNG0 to FNG3 even in the same block BLK.

The word lines WL0 to WL7 are respectively connected to control gate electrodes of the memory cell transistors MT0 to MT7 forming the NAND string NS, and i-th memory cell transistors MTi (i=0 to n) in the respective NAND strings NS in the same finger FNG are commonly connected by the same word line WLi (i=0 to n). That is, the control gate electrodes of the memory cell transistors MTi in the same row in the block BLK are connected to the same word line WLi.

The respective NAND strings NS are connected to the word line WLi and also connected to a bit line. Respective memory cells in the respective NAND strings NS can be identified by an address for identifying the word line WLi and the select gate lines SGD0 to SGD3 and an address for identifying the bit line. As described above, data of the memory cells (memory cell transistors MT) in the same block BLK are collectively erased. Meanwhile, reading and writing of data are performed in units of a physical sector MS. One physical sector MS includes a plurality of memory cells that are connected to one word line WLi and belong to one finger FNG.

The controller 200 performs write (program) in units of all NAND strings NS connected to one word line in one finger. Accordingly, a unit of the amount of data programmed by the controller 200 is 4 bits×the number of bit lines.

During a read operation and a program operation, one word line WLi and one select gate line SGD are selected according to a physical address, and the physical sector MS is selected. In the present specification, writing data to a memory cell is also referred to as programming.

Figure 11:
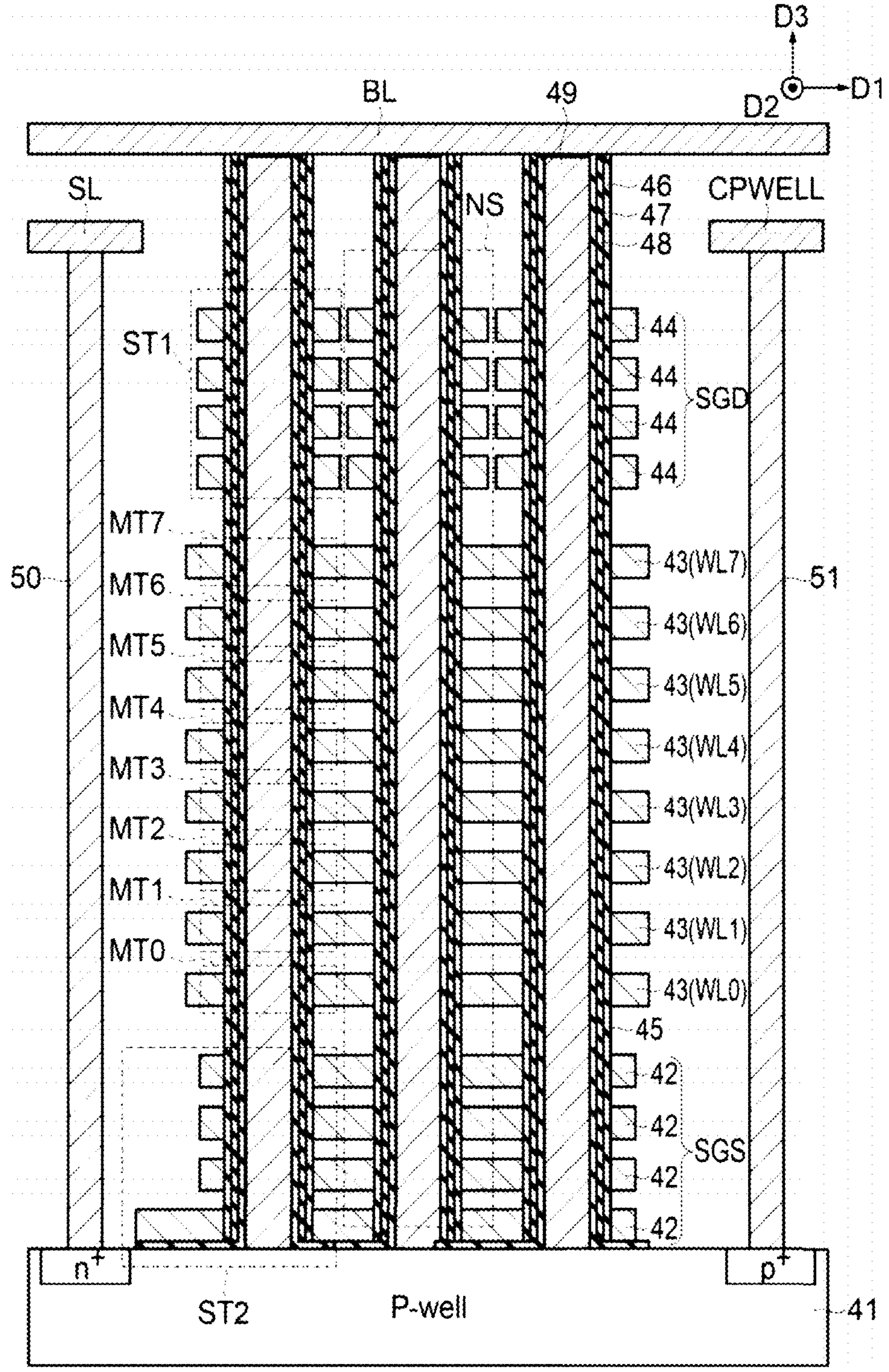
FIG. 11 is a cross-sectional view of part of a NAND flash memory cell array of a NAND flash memory having a three-dimensional structure.

FIG. 11 is a cross-sectional view of part of the NAND flash memory cell array 110 of the NAND flash memory 100 having a three-dimensional structure. As illustrated in FIG. 11, the plurality of NAND strings NS are formed in a vertical direction on a p-type well region (P-well) 41 of a semiconductor substrate. That is, a plurality of wiring layers 42 functioning as the select gate lines SGS, a plurality of wiring layers 43 functioning as the word lines WLi, and a plurality of wiring layers 44 functioning as the select gate lines SGD are formed in the vertical direction on the p-type well region 41.

Then, memory holes 45 penetrating the wiring layers 42, 43, and 44 to reach the p-type well region 41 are formed. A block insulating film 46, a charge storage layer 47, and a gate insulating film 48 are subsequently formed on a side surface of the memory hole 45, and further, a conductive film 49 is buried in the memory hole 45. The conductive film 49 functions as the current path for the NAND string NS and is a region in which a channel is formed during operations of the memory cell transistors MT and the select transistors ST1 and ST2. The charge storage layer 47 may be formed as a charge trap film or may be formed as a floating gate.

In each of the NAND strings NS, the select transistor ST2, the plurality of memory cell transistors MT, and the select transistor ST1 are sequentially stacked on the p-type well region 41. A wiring layer functioning as a bit line BL is formed on an upper end of the conductive film 49.

Furthermore, an $n^+$-type impurity diffusion layer and a $p^+$-type impurity diffusion layer are formed in a surface of the p-type well region 41. A contact plug 50 is formed on the $n^+$-type impurity diffusion layer, and a wiring layer functioning as a source line SL is formed on the contact plug 50. Further, a contact plug 51 is formed on the $p^+$-type impurity diffusion layer, and a wiring layer functioning as a well wire CPWELL is formed on the contact plug 51. The well wire CPWELL is used to apply an erasing voltage.

The NAND flash memory cell array 110 illustrated in FIG. 11 includes a plurality of NAND flash memory cell arrays arranged in a depth direction of a paper surface of FIG. 11, and one finger FNG is formed by a set of a plurality of NAND strings NS arranged in a row in the depth direction. The other fingers FNG are formed, for example, in the left-right direction of FIG. 11. FIG. 10 illustrates four fingers FNG0 to FNG3, and FIG. 11 illustrates an example in which three fingers are disposed between the contact plugs 50 and 51.

Figure 12:
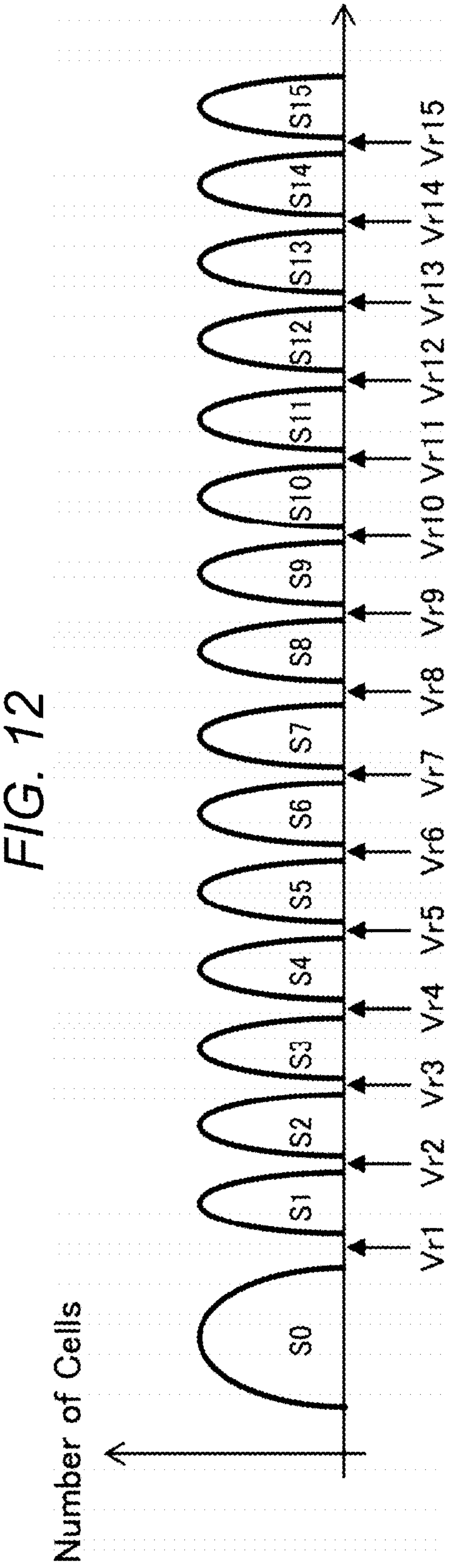
FIG. 12 is a diagram illustrating an example of a threshold voltage distribution of memory cell transistors in a solid state drive (SSD).

FIG. 12 is a diagram illustrating an example of a threshold voltage distribution of the memory cell transistors MT in the SSD according to the present embodiment. FIG. 12 illustrates an example of a distribution of a threshold voltage region of a non-volatile memory of 4-bit/Cell (quadruple level cell (QLC)). The non-volatile memory stores information by using the amount of electric charges of electrons stored in the charge storage layer 47 of the memory cell. Each memory cell has a threshold voltage according to the amount of electric charge of electrons. Then, a plurality of data values stored in the memory cell are made to respectively correspond to a plurality of regions (threshold voltage regions) having different threshold voltages.

Regions S0 to S15 in FIG. 12 illustrate a threshold voltage distribution in 16 threshold voltage regions. A horizontal axis of FIG. 12 represents a threshold voltage, and a vertical axis represents the number of memory cells (number of cells). The threshold voltage distribution indicates a range in which a threshold voltage varies. As such, each memory cell has 16 threshold voltage regions separated by 15 boundaries, and each threshold voltage region has a unique threshold voltage distribution. Vr1 to Vr15 are threshold voltages that serve as boundaries between the respective threshold voltage regions.

In a non-volatile memory such as the NAND flash memory 100, a plurality of data values are correlated with a plurality of threshold voltage regions of a memory cell. The correlation is called data coding. The data coding is defined in advance, and at the time of writing (programming) data, electric charges are injected into the charge storage layer 47 in the memory cell so as to be in the threshold voltage region corresponding to the data value to be stored according to the data coding. Then, at the time of reading, a read voltage is applied to the memory cell, and a data logic is determined depending on whether the threshold voltage of the memory cell is lower or higher than a read voltage.

When reading data, a logic of the data is determined depending on whether the threshold voltage of the memory cell to be read is lower or higher than a read level of a boundary of a read target. When the threshold voltage is the lowest, the data is in an "erased" state, and data of all bits is defined as "1". When the threshold voltage is higher than the "erased" state, the data is in a "programmed" state, and the data is defined as "1" or "0" according to coding.

As described above, when gamma rays cause Compton scattering in the memory cell to generate secondary electrons, a threshold voltage of a memory cell changes, and the threshold voltage distribution in FIG. 12 also changes. By changing the threshold voltage distribution, at least one bit of multi-value data is inverted. When all memory cells are erased and power is turned off and then the power is turned on again, the controller 3 (the host controller 3*b* or the memory controller 3*a*) illustrated in FIG. 12 reads data of all the memory cells in the NAND flash memory 100 and detects a bit inversion caused by Compton scattering of gamma rays.

As such, in the third embodiment, the NAND flash memory can be used to detect gamma rays easily and accurately without power consumption.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A radiation detection device comprising:

a first memory module mounted on a first substrate electrically connected to a first connection interface, the first memory module including a plurality of first memory chips that are vertically stacked on top of one another and mounted on the first substrate, each of the first memory chips including a plurality of vertically-stacked and non-volatile first memory cells;

a second memory module mounted on a second substrate that is above the first memory module and electrically connected to a second connection interface, the second memory module including a plurality of second memory chips that are vertically stacked on top of one another and mounted on the second substrate, each of the second memory chips including a plurality of vertically-stacked and non-volatile second memory cells; and a controller electrically connected to the first and second connection interfaces and configured to detect gamma rays according to a data inversion or a threshold voltage change of at least some of the non-volatile memory cells in the first and second memory modules.

2. The radiation detection device according to claim 1, wherein the first memory module and the second memory module are each separately packaged.

3. The radiation detection device according to claim 2, wherein the first memory module is obtained by stacking and sealing the plurality of first non-volatile memory chips on a first supporting substrate, which includes an interface for transmitting and receiving data to and from the controller through the first connection interface, and the second memory module is obtained by stacking and sealing the plurality of second non-volatile memory chips on a second supporting substrate, which includes an interface for transmitting and receiving data to and from the controller through the second connection interface, and when detecting the gamma rays, the controller reads data from all the first non-volatile memory chips via a corresponding one of the interfaces and the first connection interface and from all the second non-volatile memory chips via a corresponding one of the interfaces and the second connection interface.

4. The radiation detection device according to claim 1, further comprising:

a collimator provided on one main surface of the the second memory module.

5. The radiation detection device according to claim 4, wherein the collimator has a medium that absorbs the gamma rays and pinholes formed through the medium by which the gamma rays are incident on the one main surface.

6. The radiation detection device according to claim 5, wherein the controller detects an incident direction of the gamma rays according to an extending direction of the pinholes.

7. The radiation detection device according to claim 1, wherein the controller detects an energy intensity of the gamma rays according to a degree of change in the threshold voltages of the non-volatile memory cells.

8. The radiation detection device according to claim 1, wherein the controller detects a dose of the gamma rays by counting the number of non-volatile memory cells that underwent the data inversion or the threshold voltage change within a predetermined time period.

9. The radiation detection device according to claim 1, wherein each of the first and second memory chips is a flash memory chip having a three-dimensional structure of stacked memory cells.

10. The radiation detection device according to claim 1, wherein the first and second memory modules are vertically aligned so that all of the first memory chips and the second memory chips have overlapping portions when viewed in a vertical direction.

11. A semiconductor memory device comprising:

a first memory module mounted on a first substrate electrically connected to a first connection interface, the first memory module including a plurality of first memory chips that are vertically stacked on top of one another and mounted on the first substrate, each of the first memory chips including a plurality of vertically-stacked and non-volatile first memory cells;

a second memory module mounted on a second substrate that is above the first memory module and electrically connected to a second connection interface, the second memory module including a plurality of second memory chips that are vertically stacked on top of one another and mounted on the second substrate, each of the second memory chips including a plurality of vertically-stacked and non-volatile second memory cells; and a controller electrically connected to the first and second connection interfaces and configured to control reading and writing of data from and to the non-volatile memory chip and detect gamma rays according to a data inversion or a threshold voltage change of at least some of non-volatile memory cells in the first and second memory modules.

12. The semiconductor memory device according to claim 11, wherein each of the first and second memory chips is a flash memory chip having a three-dimensional structure of stacked memory cells.

13. The semiconductor memory device according to claim 11, wherein the first and second memory modules are vertically aligned so that all of the first memory chips and the second memory chips have overlapping portions when viewed in a vertical direction.

14. The semiconductor memory device according to claim 11, wherein the first memory module and the second memory module are each separately packaged.

15. The semiconductor memory device according to claim 11, wherein the controller detects an energy intensity of the gamma rays according to a degree of change in the threshold voltages of the non-volatile memory cells.

16. The semiconductor memory device according to claim 11, wherein the controller detects a dose of the gamma rays by counting the number of non-volatile memory cells that underwent the data inversion or the threshold voltage change within a predetermined time period.

17. A radiation detection method that employs a radiation detection device that includes a memory chip including a plurality of non-volatile memory cells, said method comprising:

while power is supplied to the radiation detection device, erasing all of the non-volatile memory cells of the memory chip;

cutting off the power supplied to the radiation detection device after having erased all of the non-volatile memory cells of the memory chip;

while power to the radiation detection device is cut off and while all of the non-volatile memory cells of the memory chip are in an erased state, placing the radiation detection device in a gamma ray detection area for a period of time;

after the period of time has elapsed, re-supplying the power to the radiation detection device and detecting gamma rays incident on the radiation detection device according to a data inversion or a threshold voltage change of at least some of the non-volatile memory cells in the memory chip.

18. The radiation detection method according to claim 17, wherein the radiation detection device includes a plurality of memory chips, each including a plurality of non-volatile memory cells, which are erased before the power supplied to the radiation detection device is cut off, and the gamma rays incident on the radiation detection device are detected according to a data inversion or a threshold voltage change of at least some of the non-volatile memory cells in all of the memory chips.

19. The radiation detection method according to claim 17, further comprising:

detecting an energy intensity of the gamma rays according to a degree of change in the threshold voltages of the non-volatile memory cells.

20. The radiation detection method according to claim 17, further comprising:

detecting a dose of the gamma rays by counting the number of non-volatile memory cells that underwent the data inversion or the threshold voltage change within a predetermined time period.

* * * * *